(12) United States Patent
Chen et al.

(10) Patent No.: US 7,352,577 B2
(45) Date of Patent: Apr. 1, 2008

(54) LIQUID-COOLED HEAT DISSIPATION MODULE

(75) Inventors: Lee-Long Chen, Taoyuan Hsien (TW); Chien-Hsiung Huang, Taoyuan Hsien (TW); Yu-Hsien Lin, Taoyuan Hsien (TW); Wen-Shi Huang, Taoyuan Hsien (TW); Chin-Ming Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 428 days.

(21) Appl. No.: 11/185,862

(22) Filed: Jul. 21, 2005

(65) Prior Publication Data

US 2006/0191669 A1    Aug. 31, 2006

(30) Foreign Application Priority Data

Feb. 25, 2005    (TW) ............................... 94105753 A (51) Int. Cl.
*H05K 7/20* (2006.01)
(52) U.S. Cl. ...................... 361/699; 361/696; 361/698; 361/701; 361/702; 165/80.4; 165/80.5; 165/104.21; 165/104.22; 62/259.2
(58) Field of Classification Search ................ 361/687, 361/690, 692, 695–699, 717–719, 722; 62/259.2; 257/714–716, 722; 165/80.3, 80.4, 80.5, 165/104.21, 104.22, 104.33, 104.34, 185; 417/372, 410.3; 310/103, 104; 384/114, 384/115, 292, 313
See application file for complete search history.

(56) References Cited

U.S. PATENT DOCUMENTS

| 6,208,512 | B1 * | 3/2001 | Goldowsky et al. ........ 361/699 |
| 6,580,610 | B2 * | 6/2003 | Morris et al. ................ 361/699 |
| 6,600,649 | B1 * | 7/2003 | Tsai et al. .................... 361/697 |
| 6,894,899 | B2 * | 5/2005 | Wu et al. ..................... 361/699 |
| 6,945,314 | B2 * | 9/2005 | Farrow et al. ............. 165/80.3 |
| 7,124,811 | B2 * | 10/2006 | Crocker et al. ......... 165/104.33 |
| 7,143,820 | B2 * | 12/2006 | Crocker et al. ......... 165/104.33 |

* cited by examiner

*Primary Examiner*—Michael Datskovskiy
(74) *Attorney, Agent, or Firm*—Birch, Stewart, Kolasch & Birch, LLP (57) ABSTRACT

A liquid-cooled heat dissipation module for circularly dissipating heat from a heat source. The liquid-cooled heat dissipation module includes a fan having a base; a pump disposed on the base; a heat sink coupled to the fan and having an opening to receive the pump; and a guide part disposed in the opening of the heat sink, communicated to the pump and having an outer surface, a through hole and a guide passage formed on the outer surface. The pump drives a working fluid in the liquid-cooled heat dissipation module to pass through the through hole, the pump and the guide passage to circularly dissipate heat.

21 Claims, 7 Drawing Sheets

LIQUID-COOLED HEAT DISSIPATION MODULE

BACKGROUND

The invention relates to a liquid-cooled heat dissipation module, and in particular to a liquid-cooled heat dissipation module integrally formed by a fan, a pump and a heat sink.

With the evolution of CPU or electronic component placement techniques, high performance and efficient data calculation can be obtained. A large amount of heat, however, is continuously generated due to high-frequency oscillation or electromagnetic effect generated by operation of the CPU or electronic component. Inefficient heat dissipation leads to CPU or electronic component breakdown or burnout. In general, a heat sink is disposed on a heat source to absorb its generated heat, and a fan or impeller is used to dissipate heat from accumulated in the heat sink.

Heat from a CPU of a high-level system, however, cannot be efficiently dissipated by an air cooling system, and requires a liquid-cooling system or similar. A pump is required to circulate low-temperature and high-temperature fluid in the system.

Figure 1:
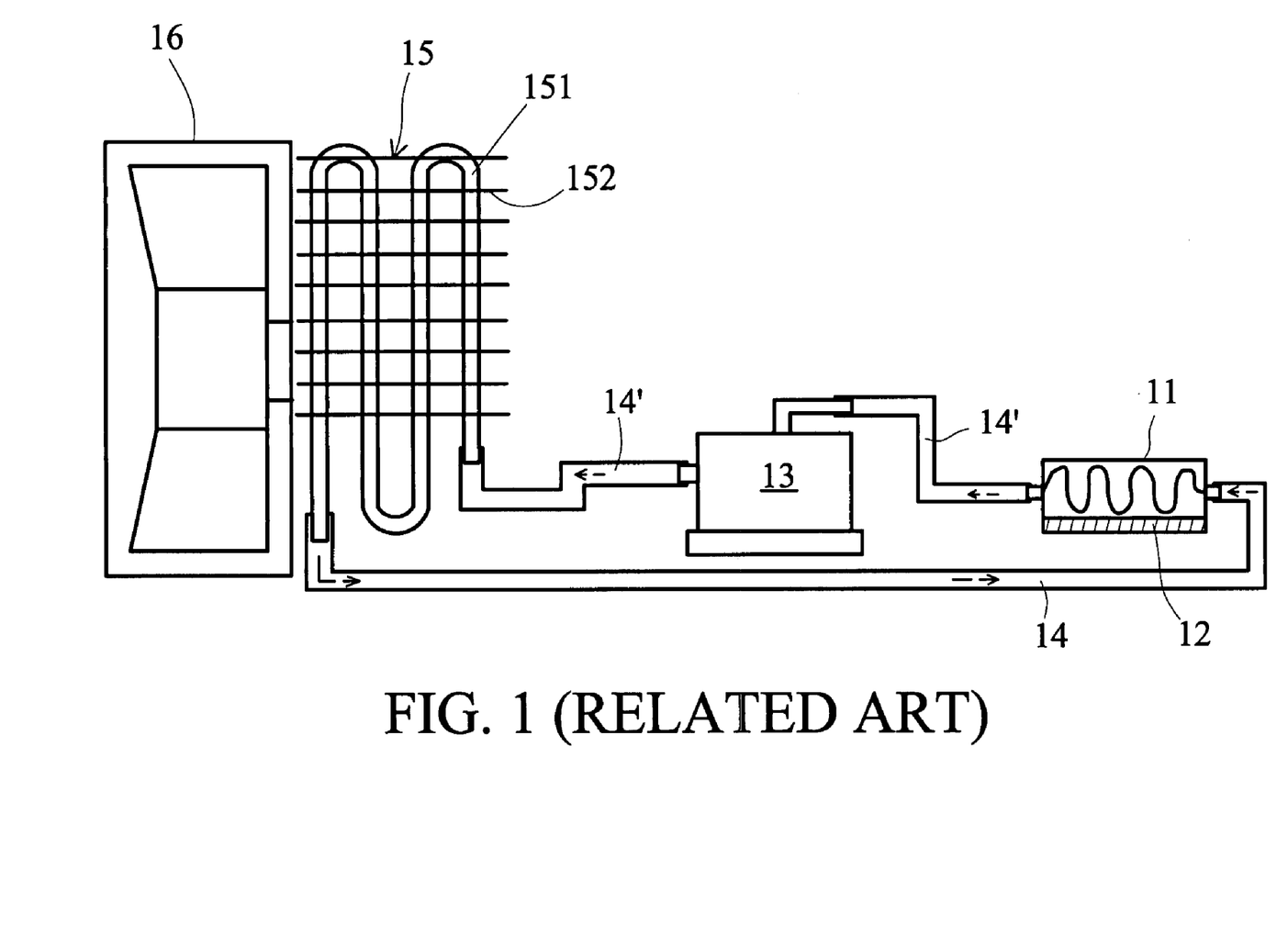
FIG. 1 is a schematic diagram of a conventional water-cooled heat dissipation system for a CPU of a high-level system.

In FIG. 1, a conventional water-cooled heat dissipation system designed for a CPU 12 of a high-level system includes a copper seat 11, a pump 13, two conduits 14/14', a heat sink 15 having a heat pipe 151 and a plurality of fins 152, and a fan 16. The bottom of the copper seat 11 is attached to the CPU 12 to absorb heat transmitted therefrom. The water of low temperature in the conduit 14 is transmitted to an S-shaped dissipative passage of the copper seat 11 by the pump 13, inflowing into a right-side inlet and output from a left-side outlet of the copper seat 11 (shown by dotted lines), to absorb heat from the CPU 12. The heated water in the conduit 14' is transmitted to a heat pipe 151 of the heat sink 15 by the pump 13, and a plurality of fins 152 absorb heat from the heated water in the conduit 14'. The fan 16 blows the fins 152 to dissipate heat thereon to the exterior, to reduce the temperature of the water in the conduit 14'. Thus, the cooled water in the conduit 14' circulates to the copper seat 11 to absorb heat from the copper seat 11.

The conventional water-cooled system has several drawbacks including: requiring a lot of conducts; unreliable connection between the conduits 14/14' and the inlet/outlet of the copper seat 11; difficulties in installation of the water and exhaust gas; complicated assembly requiring many components; and the need of large space and volume. Thus, assembly of the water-cooled system is time-consuming and costly.

SUMMARY

The invention provides a liquid-cooled heat dissipation module integrally formed by a fan, a pump, and a heat sink.

The invention additionally provides a liquid-cooled heat dissipation module integrally formed by a fan, a pump, a heat sink and a conductive seat, reducing the number of conduits, preventing liquid leakage and increasing reliability thereof.

The liquid-cooled heat dissipation module for circularly dissipating heat from a heat source comprises: a fan comprising a base; a pump disposed on the base; a heat sink coupled to the fan, comprising an opening to receive the pump; and a guide part disposed in the opening of the heat sink, communicated to the pump and comprising an outer surface, a through hole and a guide passage formed on the outer surface. When the pump drives a working fluid in the liquid-cooled heat dissipation module passing through the through hole, the pump and the guide passage circularly dissipate heat.

The guide part, preferably made of plastic, is tightly fitted into the opening of the heat sink. The guide part and the heat sink are made of the same material.

The guide passage has a spiral, oblique, straight, serrated, stepped or other similar shape. An inner wall of the opening of the heat sink comprises a smooth surface, and the guide passage is formed between the inner wall of the opening of the heat sink and the outer surface of the guide part when the guide part is tightly fitted into the opening of the heat sink. Preferably, the inner wall of the opening of the heat sink comprises a passage corresponding to a shape of the guide passage, and the guide passage is formed between the inner wall of the opening of the heat sink and the outer surface of the guide part when the guide part is tightly fitted into the opening of the heat sink.

The heat sink further comprises an inlet communicated with the through hole of the guide part and an outlet communicated with the guide passage.

The heat sink further comprises an injecting hole for inflow of the working fluid.

The liquid-cooled heat dissipation module further comprises a cushion valve disposed in the injecting hole. The cushion valve comprises a circularly teethed structure with an upper segment movable along an axial direction and a lower segment tightly fitted with an inner wall of the injecting hole. The cushion valve is preferably made of soft rubber.

The liquid-cooled heat dissipation module further comprises a cap to seal the end of the opening of the heat sink. The cap is preferably made of a conductive material or metallic material, and a surface of the cap is attached to the heat source.

The pump is connected to the base of the fan by locking, engaging, riveting, adhesion or ultrasonic fusion.

Preferably, the liquid-cooled heat dissipation module further comprises a conductive seat attached on the heat source, so that heat from the operating heat source is carried by the working fluid. The conductive seat comprises a chassis, a cover and a dissipative passage, wherein the dissipative passage comprises a concentric vortex structure or an inside-outwardly extending spiral structure. The dissipative passage on the chassis is formed by milling. The cover covering the chassis and the dissipative passage are integrally formed by injection molding. An O-ring is disposed between the chassis and the cover. The conductive seat is made of copper.

Preferably, the fan and the pump are actuated by a single motor, wherein the fan can be a DC fan or an AC fan.

The invention provides another liquid-cooled heat dissipation module for dissipating heat from a heat source. The liquid-cooled heat dissipation module comprises: a pump; a heat sink having an opening to receive the pump; and a guide part disposed in the opening of the heat sink communicated with the pump, and having an outer surface, a through hole and a guide passage formed on the outer surface. The pump drives a working fluid in the liquid-cooled heat dissipation module to pass through the through hole, the pump and the guide passage to circularly dissipate heat.

BRIEF DESCRIPTION OF THE DRAWINGS

The invention can be more fully understood by reading the subsequent detailed description and examples with references made to the accompanying drawings, wherein.

DETAILED DESCRIPTION

Figure 2:
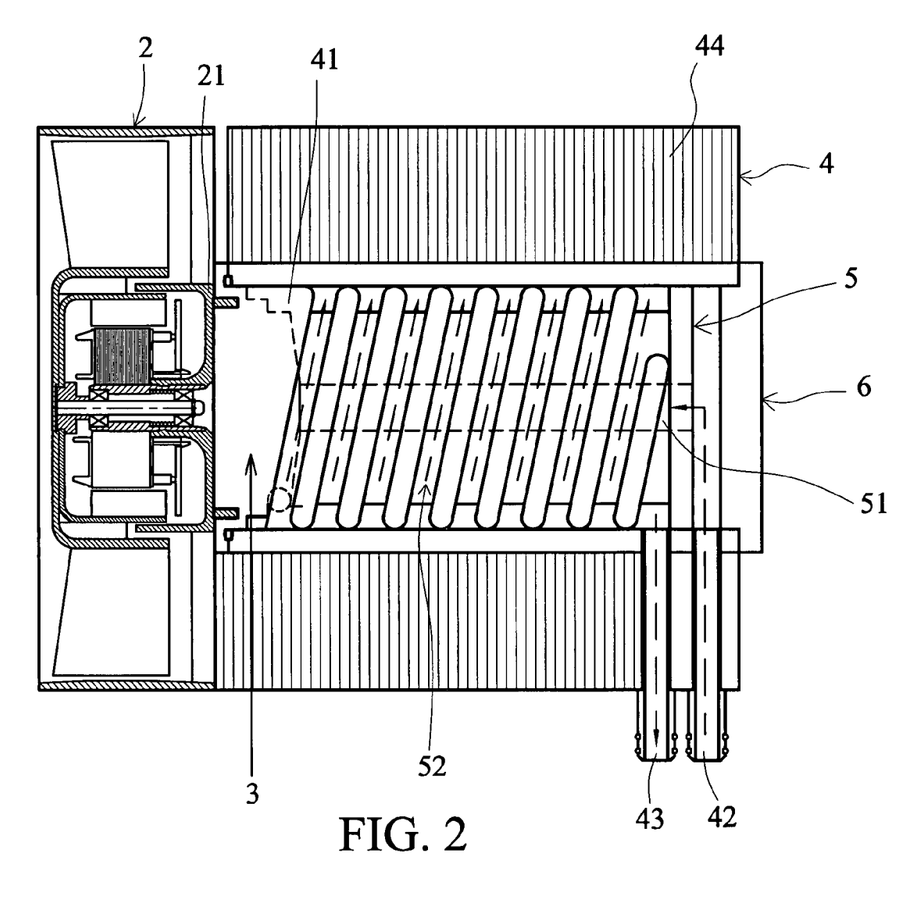
FIG. 2 is a schematic sectional view of the first embodiment of a liquid-cooled heat dissipation module of the invention.

In FIG. 2, a liquid-cooled heat dissipation module of a first embodiment of the invention includes a first heat dissipation device 2, a pump 3, and a second heat dissipation device 4. The first heat dissipation device 2 is a fan and the second heat dissipation device 4 is a heat sink having a plurality of fins 44, a guide part 5 and a cap 6.

The fan 2 includes a base 21 and the pump 3 is disposed on the base 21. The heat sink 4 coupled to the fan 2 has an opening 41 to receive the pump 3 therein. The guide part 5 is disposed in the opening 41 of the heat sink 4 and connected to the pump 3, and has an outer surface, a through hole 51 and a spiral guide passage 52 formed on the outer surface. In this embodiment, the guide part 5 is preferably made of plastic.

Note that the guide part 5 tightly fits into the opening 41 of the heat sink 4. One end of the opening 41 of the heat sink 4 is coupled to the fan 2 and the pump 3, and the other end of the opening 41 of the heat sink 4 is sealed by the cap 6.

The heat sink 4 further includes an inlet 42 and an outlet 43 on the bottom thereof. The inlet 42 is communicated with the through hole 51 of the guide part 5, inflowing a working fluid e.g. water, with high-temperature from the heat source, and the outlet 43 is communicated to the bottom of the guide passage 52.

When the fan 2 and the pump 3 are operated, the driven working fluid passes through the through hole 51 of the guide part 5, absorbs heat from the heat source and is output from the periphery of the pump 3. The working fluid from the pump 3 passes through the guide passage 52 formed between the outer surface of the guide part 5 and the smooth inner wall of the opening 41 of the heat sink 4 and arrives at the bottom of the heat sink 4, i.e., near to one side of the cap 6. When the working fluid passes through the through hole 51 of the guide part 5 and the guide passage 52, heat from the working fluid transmits to the fins 44 of the heat sink 4 and the fan 2 cools the fins 44 by dissipating heat wherefrom to the exterior, resulting in the working fluid located at the bottom of the guide passage 52 having the lowest temperature. In FIG. 2, dotted lines show the path of the circulating working fluid input from the inlet 42 and output from the outlet 43 to flow toward the heat source so as to remove heat from the heat source.

Figure 3:
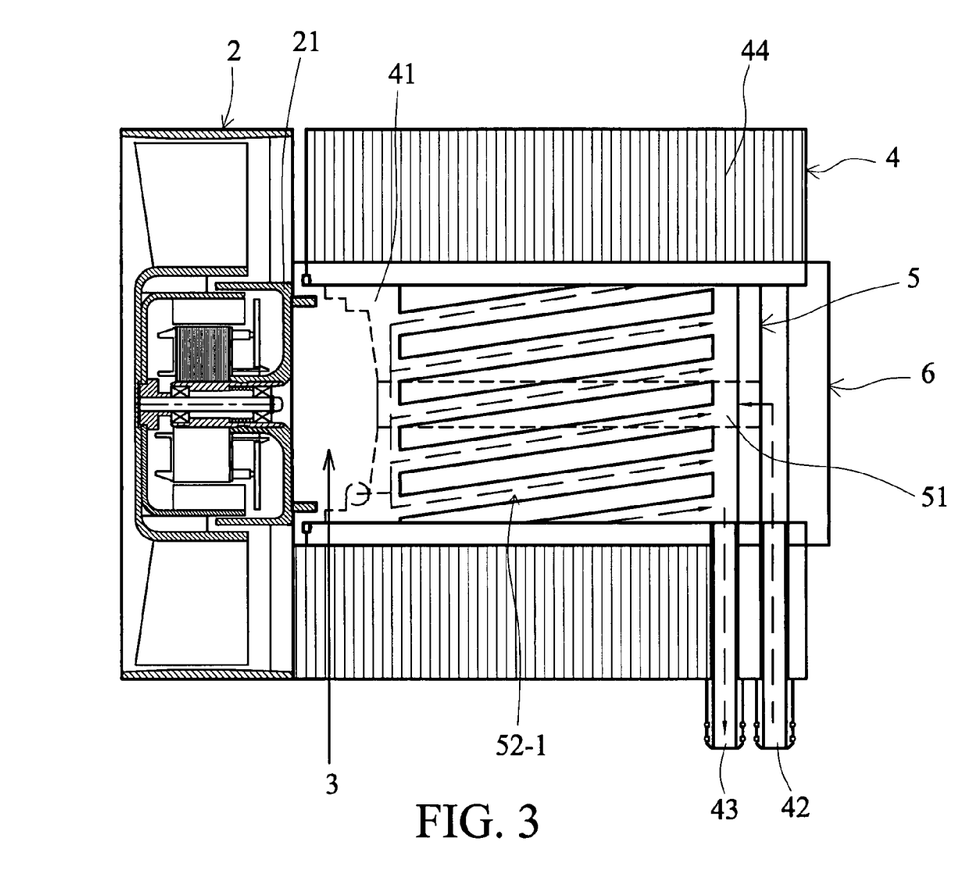
FIG. 3 is a schematic sectional view of the second embodiment of a liquid-cooled heat dissipation module of the invention.
Figure 4:
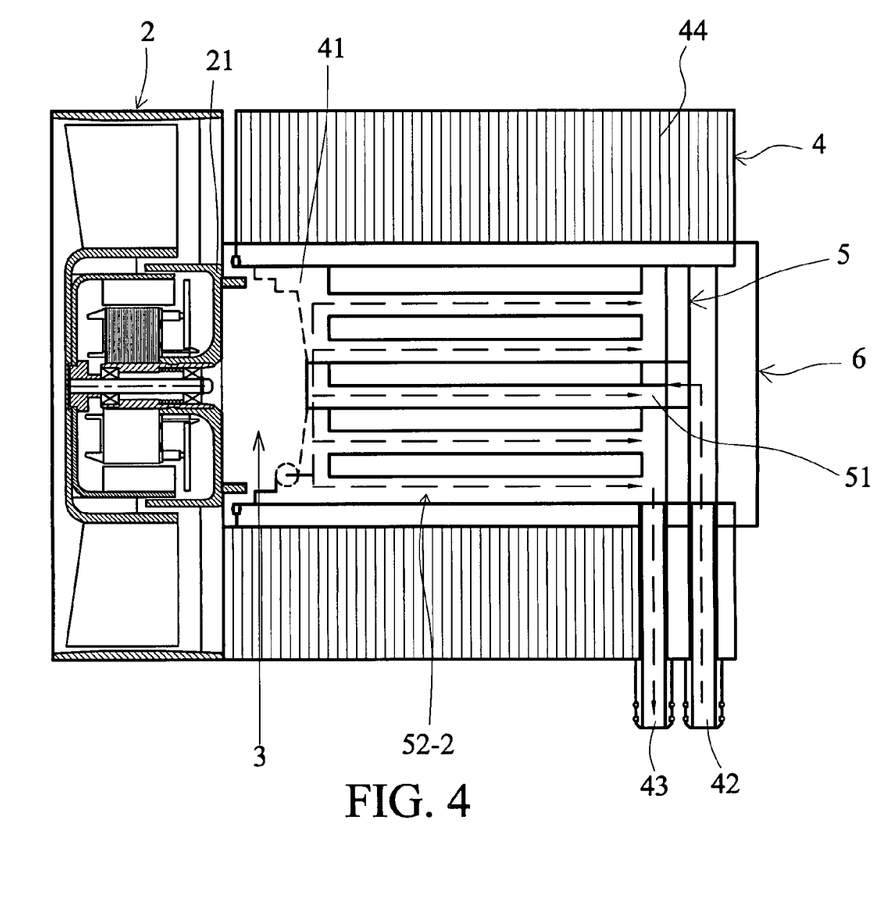
FIG. 4 is a schematic sectional view of the third embodiment of a liquid-cooled heat dissipation module of the invention.

In FIGS. 3 and 4, two liquid-cooled heat dissipation modules of the second and third embodiments differ from the first embodiment in that a guide passage 52-1 is oblique or diagonal in the second embodiment and a guide passage 52-2 is straight in the third embodiment. It is to be understood that the invention is not limited to the referred guide passages, but, on the contrary, is intended to apply serrated, stepped or other similar guide passages.

Note that the guide parts of the preferred embodiment can be made of same material as the heat sink 4, e.g., aluminum. The inner wall of the opening 41 of the heat sink 4 can have an indented passage corresponding to the shape of the guide passage 52. When the guide part 5 tightly fits into the opening 41 of the heat sink 4, the guide passage 52 is formed between the inner wall of the opening 41 of the heat sink 4 and the outer surface of the guide part 5.

Figure 5:
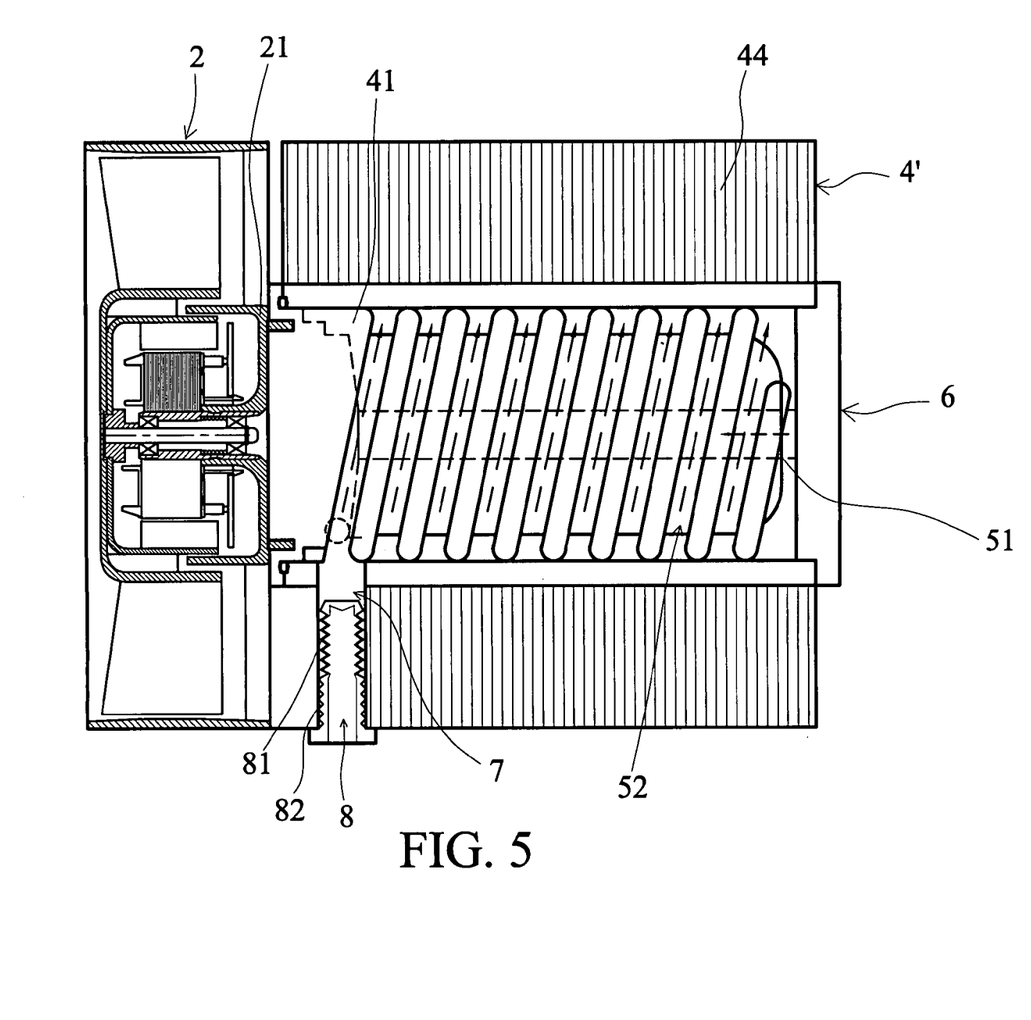
FIG. 5 is a schematic sectional view of the fourth embodiment of a liquid-cooled heat dissipation module of the invention.

In FIG. 5, a liquid-cooled heat dissipation module of the fourth embodiment differs from the above-described embodiments in that the inlet 42 and the outlet 43 are omitted, and the heat sink 4' further includes an injecting hole 7 and a cushion valve 8. The injecting hole 7 is formed at the end of the opening 41, i.e., near the fan 2 and the pump 3 or next to an interconnection between the fan 2/the pump 3 and the heat sink 4.

The cushion valve 8 seals the injecting hole 7 when the working fluid inflows into the liquid-cooled heat dissipation module via the injecting hole 7. The cushion valve 8 is preferably made of soft rubber and has a circularly teethed structure with an upper segment 81 movable along an axial direction of the injecting hole 7 and a lower segment 82 tightly fit with an inner wall of the injecting hole 7, to moderate the internal pressure generated from cold shrinkage and hot bulging on the guide passage 52 and prevent the leakage of working fluid.

The cap 6 is preferably made of a conductive or metallic material, and the outer surface of the cap 6 seals the other end of the opening 41 of the heat sink 4 and can be directly attached to the heat source. When heat generated from the heat source is transmitted to the cap 6 and the temperature of the working fluid increases, the heated working fluid sequentially passes through the through hole 51 of the guide part 5 and the pump 3 and the guide passage 52 between the outer surface of the guide part 5 and the inner wall of the opening 41 of the heat sink 4. The fins 44 of the heat sink 4 absorb heat transmitted from the working fluid, and the fan 2 cools the fins 44 by dissipating heat to the exterior, resulting in the working fluid located at the bottom, i.e., near the cap 6, of the guide passage 52 having the lowest temperature to continuously circulate and dissipate the heat. The path of the circulating working fluid is indicated by the dotted line shown in FIG. 5.

Figure 6A:
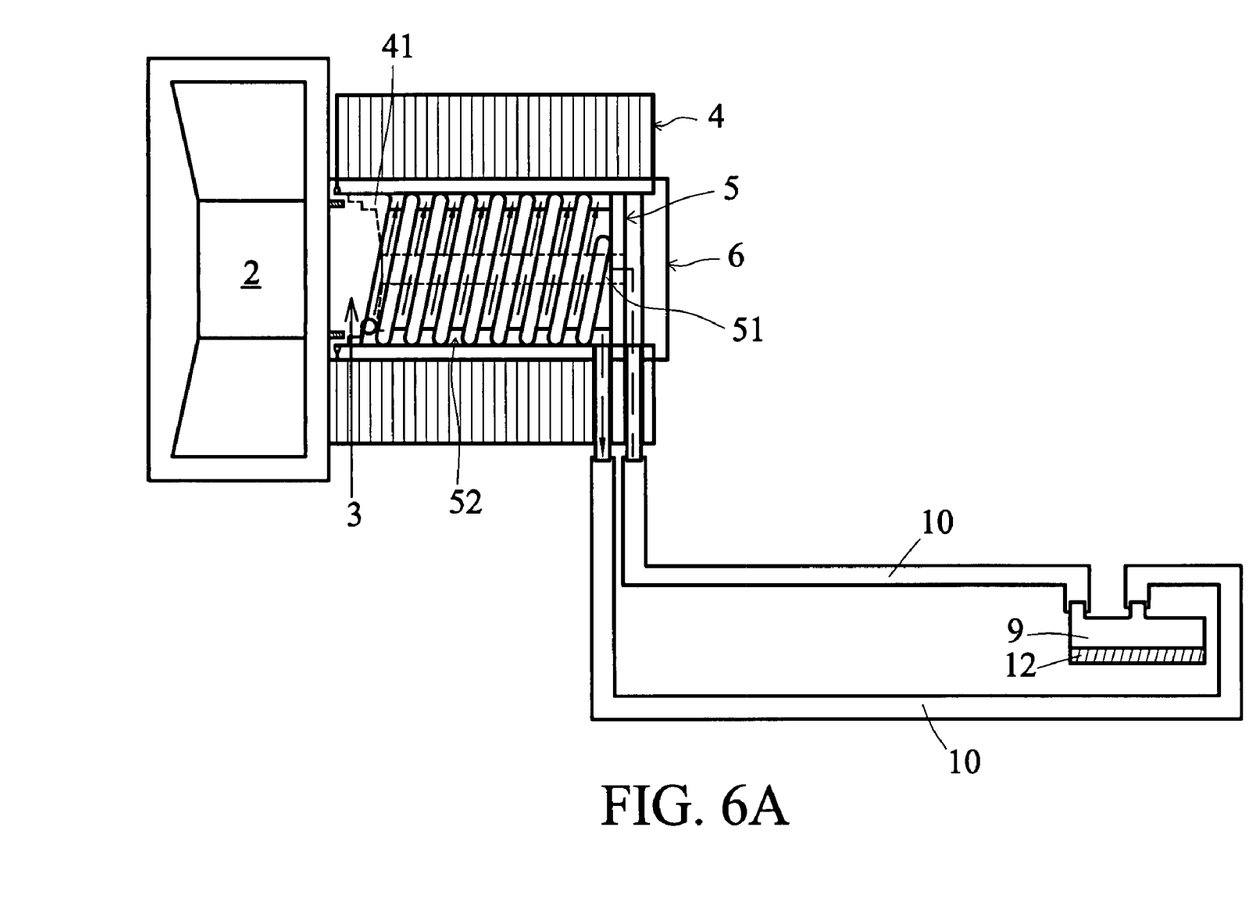
FIG. 6A is a schematic view of a liquid-cooled heat dissipation module of the invention for a CPU of a high-level system.

In the actual application, the liquid-cooled heat dissipation externally module of the first, second and third embodiments can be connected with a conductive seat 9 via a conduit 10. The bottom surface of the conductive seat 9 is attached to a heat source 12, e.g., a CPU, as shown in FIG. 6A.

Figure 6B:
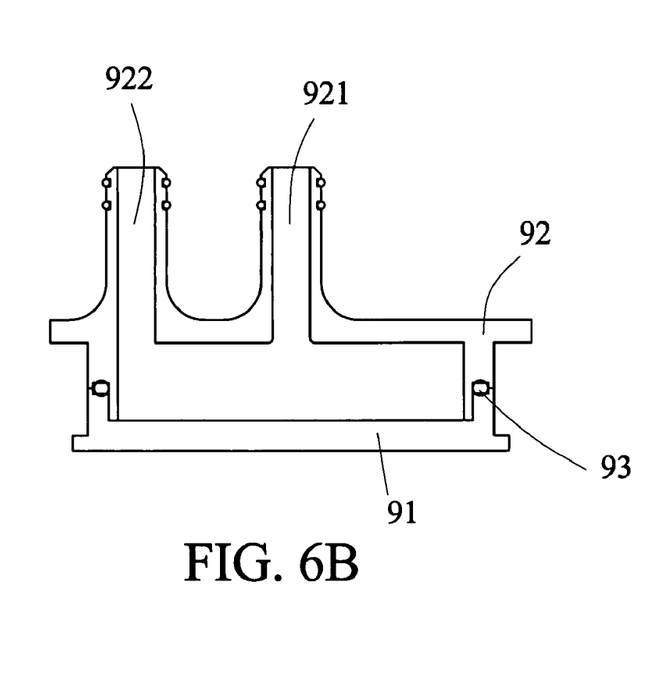
FIG. 6B is a schematic view of the inner structure of a conductive seat of FIG. 6A.
Figure 6C:
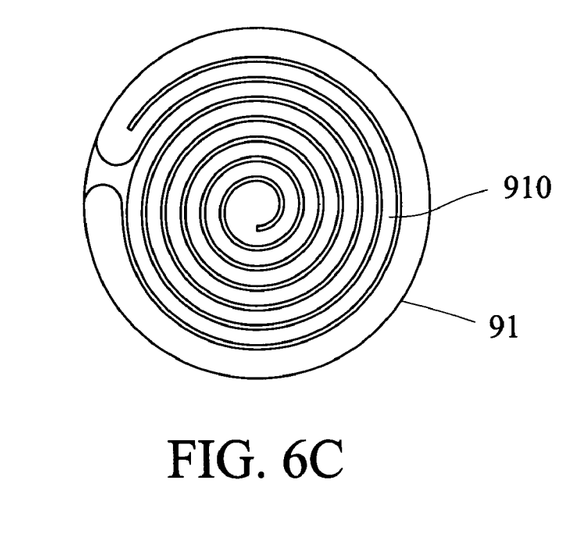
FIG. 6C is a top view of a dissipative passage of the conductive seat of FIG. 6A.

In FIGS. 6B and 6C, the conductive seat 9 comprises a chassis 91, a cover 92 having an inlet 921 and an outlet 922 and a dissipative passage 910. The chassis 91 is preferably made of copper, and the cover 92 is preferably made of plastic. The dissipative passage 910 can be formed with a concentric vortex structure or an inside-outwardly extending spiral structure. The dissipative passage 910 can be formed on the chassis 91 by milling, or the dissipative passage 910 can be integrally formed on the cover 92 by injection molding. An O-ring 93 is disposed between the chassis 91 and the cover 92. When the low-temperature working fluid enters the dissipative passage 910 via the inlet 921 of the cover 92, the working fluid absorbing heat from the heat source 12 is expelled via the outlet 922 to the inlet 42 of the heat sink 4. Heat from the heat source 12 can be rapidly transmitted to the working fluid stored in the dissipative passage 910 via the conductive seat 9, and heat from the heated working fluid passing through the through hole 51, the pump 3 and the guide passage 52 is transmitted to the fins 44 of the heat sink 4. The fan 2 cools the heated fins 44 by dissipating heat to the exterior, to continuously reduce the temperature of the circulating working fluid.

In the described embodiments, the fan 2 can be a DC fan or an AC fan, and the pump 3 can be a conventional pump or can be actuated by the same motor used to drive the fan 2. Additionally, the pump 3 can be connected to the base 21 of the fan 2 by locking, engaging, riveting, adhesion or ultrasonic fusion.

In the present invention, the pump 3, the heat sink 4 and the conductive seat 9 can be integrally formed as a whole unit, or substantially formed into two majorities, the number of conduits can be greatly reduced or even omitted, to increase reliability and prevent leakage of working fluid. Moreover, the structure of the heat dissipation module of the invention becomes a module to reduce the number of components and total volume and to rapidly and uniformly transmit heat to the smooth inner wall of the opening 41 of the heat sink.

While the invention has been described with respect to preferred embodiment, it is to be understood that the invention is not limited thereto, but, on the contrary, is intended to accommodate various modifications and equivalent arrangements included within the spirit and scope of the appended claims.

What is claimed is:

1. A liquid-cooled heat dissipation module for circularly dissipating heat from a heat source, comprising:
   a fan comprising a base;
   a pump disposed on the base;
   a heat sink coupled to the fan and comprising an opening to receive the pump; and
   a guide part disposed in the opening of the heat sink, communicated to the pump, and comprising an outer surface, a through hole and a guide passage formed on the outer surface, wherein the pump drives a working fluid in the liquid-cooled heat dissipation module passing through the through hole, the pump and the guide passage to circularly dissipate heat.

2. The liquid-cooled heat dissipation module as claimed in claim 1, wherein the guide part is made of plastic or the same material as that of the heat sink and tightly fitted into the opening of the heat sink.

3. The liquid-cooled heat dissipation module as claimed in claim 1, wherein the guide passage has a spiral, oblique, straight, serrated, stepped or other similar shape.

4. The liquid-cooled heat dissipation module as claimed in claim 1, wherein an inner wall of the opening of the heat sink has a smooth surface, and the guide passage is formed between the inner wall of the opening of the heat sink and the outer surface of the guide part when the guide part is tightly fitted into connected to the opening of the heat sink.

5. The liquid-cooled heat dissipation module as claimed in claim 1, wherein the inner wall of the opening of the heat sink comprises a passage corresponding to a shape of the guide passage to form the guide passage between the inner wall of the opening of the heat sink and the outer surface of the guide part when the guide part is tightly fitted into connected to the opening of the heat sink.

6. The liquid-cooled heat dissipation module as claimed in claim 1, wherein the heat sink further comprises an inlet communicated with the through hole of the guide part and an outlet communicated with the guide passage.

7. The liquid-cooled heat dissipation module as claimed in claim 1, wherein the heat sink further comprises an injecting hole for inflow of the working fluid.

8. The liquid-cooled heat dissipation module as claimed in claim 7 further comprising a cushion valve disposed in the injecting hole.

9. The liquid-cooled heat dissipation module as claimed in claim 8, wherein the cushion valve is made of a soft rubber.

10. The liquid-cooled heat dissipation module as claimed in claim 8, wherein the cushion valve comprises a circularly teethed structure with an upper segment movable along an axial direction and a lower segment tightly fitted with an inner wall of the injecting hole.

11. The liquid-cooled heat dissipation module as claimed in claim 1 further comprising a cap to seal the end of the opening of the heat sink.

12. The liquid-cooled heat dissipation module as claimed in claim 11, wherein the cap is made of a conductive material or metallic material, and a surface of the cap is attached to the heat source.

13. The liquid-cooled heat dissipation module as claimed in claim 1, wherein the pump is connected to the base of the fan by locking, engaging, riveting, adhesion or ultrasonic fusion.

14. The liquid-cooled heat dissipation module as claimed in claim 1 further comprising a conductive seat attached on the heat source, so that heat from the heat source in operation is carried by the working fluid.

15. The liquid-cooled heat dissipation module as claimed in claim 14, wherein the conductive seat comprises a chassis, a cover and a dissipative passage, wherein the dissipative passage comprises a concentric vortex structure or an inside-outwardly extending spiral structure.

16. The liquid-cooled heat dissipation module as claimed in claim 15, wherein the dissipative passage on the chassis is formed by milling, or the cover and the dissipative passage are integrally formed by injection molding.

17. The liquid-cooled heat dissipation module as claimed in claim 14, wherein an O-ring is disposed between the chassis and the cover, and the conductive seat comprises copper.

18. The liquid-cooled heat dissipation module as claimed in claim 1, wherein the fan and the pump are actuated by a single motor.

19. A liquid-cooled heat dissipation module for dissipating heat from a heat source, comprising:
   a pump;
   a heat sink having an opening to receive the pump; and
   a guide part disposed in the opening of the heat sink, communicated with the pump, and having an outer surface, a through hole and a guide passage formed on the outer' surface, wherein the pump drives a working fluid in the liquid-cooled heat dissipation module to pass through the through hole, the pump and the guide passage to circularly dissipate heat.

20. The liquid-cooled heat dissipation module as claimed in claim 19, further comprising a fan for generating airflow flowing toward to the heat sink.

21. The liquid-cooled heat dissipation module as claimed in claim 20, wherein the fan and the pump are actuated by a single motor.

* * * * *